(12) United States Patent
Yoshinaga

(10) Patent No.: US 8,552,643 B2
(45) Date of Patent: Oct. 8, 2013

(54) DISPLAY APPARATUS

(75) Inventor: Hideki Yoshinaga, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/945,626

(22) Filed: Nov. 12, 2010

(65) Prior Publication Data

US 2011/0141717 A1   Jun. 16, 2011

(30) Foreign Application Priority Data

Dec. 11, 2009   (JP) ................................. 2009-282284

(51) Int. Cl.
*H01J 1/62*   (2006.01)
*H01J 63/04*   (2006.01)

(52) U.S. Cl.
USPC ............................ 313/512; 313/504; 313/506

(58) Field of Classification Search
USPC .......................................... 313/504, 506, 512
See application file for complete search history.

(56) References Cited

U.S. PATENT DOCUMENTS

| | | | | |
|---|---|---|---|---|
| 6,704,072 B2 * | 3/2004 | Jeong et al. ..................... | 349/73 |
| 6,833,668 B1 * | 12/2004 | Yamada et al. ................. | 313/505 |
| 6,933,537 B2 * | 8/2005 | Yee et al. ........................ | 257/99 |
| 7,019,718 B2 * | 3/2006 | Yamazaki et al. .............. | 345/80 |
| 7,064,734 B2 * | 6/2006 | Kawamura et al. ............. | 345/80 |
| 7,145,290 B2 * | 12/2006 | Kang ............................. | 313/512 |
| 7,183,580 B2 * | 2/2007 | Hayashi et al. ................. | 257/81 |
| 7,199,855 B2 * | 4/2007 | Yoshimi et al. ................ | 349/187 |
| 7,452,738 B2 * | 11/2008 | Hayashi et al. ................ | 438/29 |
| 7,538,488 B2 * | 5/2009 | Kwak ............................ | 313/506 |
| 2002/0011975 A1 * | 1/2002 | Yamazaki et al. .............. | 345/76 |
| 2002/0030285 A1 * | 3/2002 | Sawada et al. ................. | 257/782 |
| 2002/0196393 A1 * | 12/2002 | Tashiro et al. ................. | 349/106 |
| 2003/0062533 A1 * | 4/2003 | Yee et al. ........................ | 257/99 |
| 2003/0085654 A1 * | 5/2003 | Hayashi ......................... | 313/506 |
| 2003/0164674 A1 * | 9/2003 | Imamura ....................... | 313/493 |
| 2004/0263740 A1 * | 12/2004 | Sakakura et al. .............. | 349/138 |
| 2005/0110020 A1 * | 5/2005 | Hayashi et al. ................ | 257/72 |
| 2005/0184927 A1 * | 8/2005 | Kwak ............................ | 345/45 |
| 2006/0087229 A1 * | 4/2006 | Kim ............................... | 313/509 |
| 2006/0088951 A1 * | 4/2006 | Hayashi et al. ................ | 438/99 |
| 2007/0111396 A1 | 5/2007 | Hayashi | |
| 2007/0120480 A1 * | 5/2007 | Kwon ............................ | 313/512 |

FOREIGN PATENT DOCUMENTS

| | | |
|---|---|---|
| JP | 2002-196124 A | 7/2002 |
| JP | 2005-251721 A | 9/2005 |

\* cited by examiner

*Primary Examiner* — Nimeshkumar Patel
*Assistant Examiner* — Thomas A Hollweg
(74) *Attorney, Agent, or Firm* — Canon USA Inc IP Division

(57) ABSTRACT

A display apparatus has a region where a plurality of grooves are arranged along contours of a display region so as to extend in a direction across the contours of the display region and where an organic protective film is provided so as to cover the grooves and a region, surrounding the region where the grooves are provided, where the grooves and the organic protective film are not provided.

4 Claims, 8 Drawing Sheets

DISPLAY APPARATUS

BACKGROUND OF THE INVENTION

1. Field of the Invention

The present invention relates to display apparatuses sealed with an organic protective film and an inorganic protective film.

2. Description of the Related Art

Recently, display apparatuses using self-emitting organic light-emitting elements have attracted attention as thin, lightweight display apparatuses. One of the major problems with display apparatuses using organic light-emitting elements is their resistance to moisture and oxygen. If moisture and oxygen intrude into a display apparatus, they degrade the organic compound layer material constituting the organic light-emitting elements and form dead regions, called dark spots, in the display apparatus, thus decreasing the display performance thereof.

As a solution for improving the resistance of a display apparatus to moisture and oxygen, there is a known seal structure formed by stacking an organic protective film and an inorganic protective film. In this seal structure, the inorganic protective film blocks moisture, and the organic protective film is provided to smooth irregularities in the surface of the display apparatus so that no defect occurs in the inorganic protective film. Accordingly, the organic protective film is formed so as to cover at least a region where organic light-emitting elements are provided, whereas the inorganic protective film is formed in a larger area than the organic protective film so as to cover the organic protective film and so as to contact a member formed of an inorganic material and disposed below the organic light-emitting elements in a region surrounding the organic protective film. This prevents intrusion of moisture from the surface of the organic protective film, from the region surrounding the organic protective film, and from the bottoms of the organic light-emitting elements.

Japanese Patent Laid-Open No. 2005-251721 (Patent Document 1), relating to a technique for forming an organic protective film (buffer layer) by a wet process (coating process), discloses a display apparatus having a frame portion for stopping an organic protective film material from flowing out of a predetermined region. This allows the organic protective film to be formed only in the necessary region, thus ensuring a sufficient region surrounding the organic protective film where the inorganic protective film contacts a member formed of an inorganic material and disposed below the organic light-emitting elements.

A film formation technique based on a wet process such as dispensing or printing is advantageous in terms of cost over a film formation technique based on a dry process using a vacuum device, although it has the problem described below.

FIG. 8 is a schematic sectional view of an end of a display apparatus sealed by stacking an organic protective film 10 and an inorganic protective film 11. The organic protective film 10 is formed so as to cover a display region A. The inorganic protective film 11 is formed in a region larger than the organic protective film 10 so as to cover the organic protective film 10 and so as to contact a support substrate 1 in a region surrounding the organic protective film 10. In this case, the support substrate 1 is formed of an inorganic material.

If the organic protective film 10 is formed by a wet process, a sloped portion B is formed at the end thereof, depending on the viscosity of the organic protective film material and its wettability to the support substrate 1. For example, if the position where the end of the organic protective film 10 is formed is set to a position E shifted outward from the display region A by the width b of the sloped portion B, the end of the organic protective film 10 is formed at an uncertain position between a position F shifted from the position E to the display region side by a distance of m and a position G shifted to the opposite side by a distance of m because the positional accuracy of film formation by a wet process involves an error of ±m. If the end of the organic protective film 10 is formed at the position F, the sloped portion B of the organic protective film 10 overlaps the display region A. This results in image degradation at the sloped portion B because it locally distorts a reflection of external light. Therefore, the organic protective film 10 must be formed so that the sloped portion B does not overlap the display region A.

Accordingly, one possible approach is to set the position where the end of the organic protective film material is formed to a position G separated from the position E to the side away from the display region A by a distance of m so that the end of the organic protective film 10 is not located inside the position E even if the position thereof deviates most to the display region side due to a process error. In this case, the width d required for the region outside the display region A (frame region) is represented by the following inequality:

$$d \geq b + 2m + c \qquad (1)$$

where c is the width required for a region surrounding the organic protective film 10 where the inorganic protective film 11 contacts a member formed of an inorganic material and disposed below the organic light-emitting elements. Inequality (1) suggests that, taking into account an error due to a wet process, namely, ±m, an extra width of 2 m is required in addition to the minimum width required for the frame region, namely, b+c.

According to Patent Document 1, by providing a frame portion and applying an organic protective film material with high liquidity, the end of the organic protective film can be reliably formed in a predetermined region while preventing the organic protective film material from flowing out of the predetermined region. This eliminates the need for taking the error m into account in the application of the organic protective film material. However, to form an organic protective film having a thickness sufficient to smooth irregularities in the surface of the display apparatus with a material with high liquidity, it is necessary to form a frame portion having a height equivalent to the thickness of the organic protective film. According to Patent Document 1, the frame portion is provided at a predetermined position by dispensing or screen printing using a highly viscous material. This requires an extra width taking into account an error due to a wet process, namely, 2 m, for the frame region in the step of providing the frame portion, thus resulting in the same problem as before. In addition, this technique has a problem in that the materials applicable to the organic protective film are limited because the material used requires a viscosity of about 1 to 30 cp so that it can be spread to the frame portion.

Display apparatuses using organic light-emitting elements are often used for displays of mobile devices because a reduction in thickness and weight is possible. In addition to a reduction in thickness and weight, forming a narrow frame region, that is, a reduction in frame width, and a reduction in cost are major challenges for displays of mobile devices; the technique disclosed in Patent Document 1 does not achieve a sufficient reduction in frame width.

SUMMARY OF THE INVENTION

To solve the above problem, an organic light-emitting display apparatus according to aspects of the present invention includes a substrate, a display region where a plurality of light-emitting elements are disposed on the substrate, an organic protective film covering at least the display region, and an inorganic protective film covering the organic protective film. This display apparatus has a region where a plurality of grooves are arranged along contours of the display region so as to extend in a direction across the contours of the display region and where the organic protective film is provided so as to cover the grooves and a region, surrounding the region where the grooves are provided, where the grooves and the organic protective film are not provided.

In addition, a method for producing a display apparatus according to aspects of the present invention includes the steps of forming a display region where a plurality of light-emitting elements are disposed on a substrate, forming a plurality of grooves along contours of the display region so that the grooves extend to a predetermined position in a direction across the contours of the display region, forming an organic protective film covering the display region, and forming an inorganic protective film covering the organic protective film. The step of forming the organic protective film is a step of forming the organic protective film by applying an organic protective film material and includes the substeps of applying the organic protective film material so that an end thereof is located above the grooves and spreading the organic protective film material to the predetermined position.

In the display apparatus according to the present invention, even if the position where the organic protective film is formed deviates by an error due to a wet process, the grooves can be used to spread the organic protective film material to a predetermined position, thus allowing the organic protective film material to be applied with high reproducibility. This results in a reduction in process margin, so that a display apparatus having a narrower frame region can be produced at low cost.

Further features of the present invention will become apparent from the following description of exemplary embodiments with reference to the attached drawings.

DESCRIPTION OF THE EMBODIMENTS

Figure 1A:
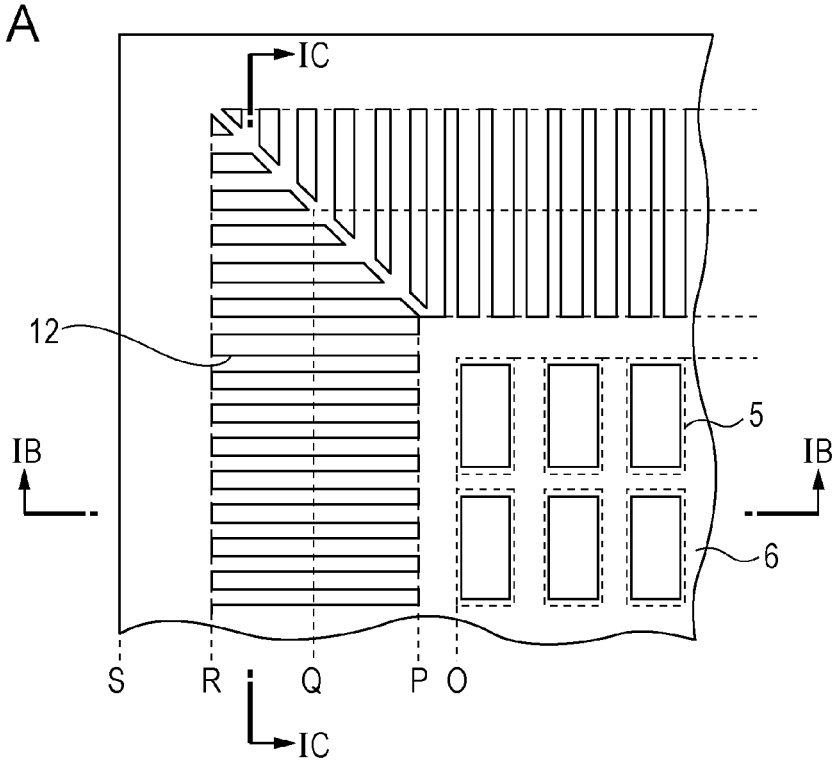
FIGS. 1A, 1B, and 1C are a top view, a sectional view, and a sectional view, respectively, schematically showing a display apparatus according to a first embodiment and Example 1 of the present invention.

Display apparatuses and methods for producing such apparatuses according to embodiments of the present invention will now be described with reference to the drawings. Throughout the drawings, common members are denoted by common reference numerals and letters, and a description of members that have once been described will be omitted thereafter.

First Embodiment

First, the structure of a display apparatus according to a first embodiment will be described, where a display region and a frame region will be separately described.

Structure of Display Region

Figure 1B:
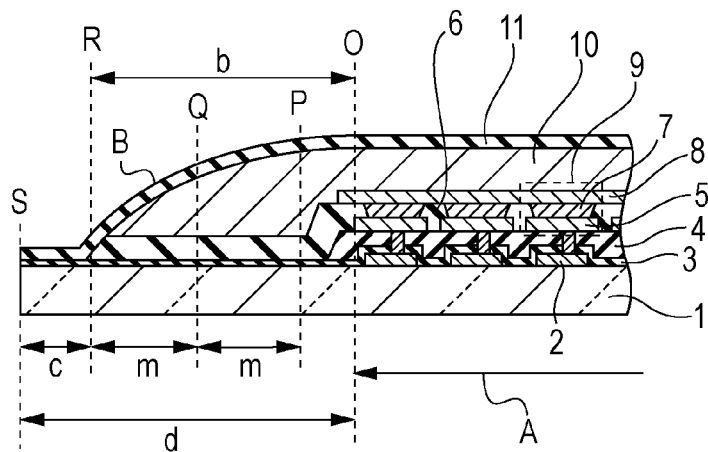
Figure 1C:
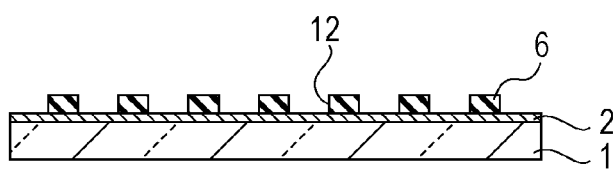

FIG. 1A is a plan view of a corner of the display apparatus according to the first embodiment. For illustration purposes, a second organic insulating film 6 is exposed in FIG. 1A. FIG. 1B is a sectional view taken along line IB-IB in FIG. 1A, with seal films added thereto. FIG. 1C is a partial sectional view taken along line IC-IC in FIG. 1A. A plurality of pixel circuits 2 for driving display elements are arranged in a display region A on a support substrate 1. The surfaces of the pixel circuits 2 are covered with an inorganic insulating film 3 and a first organic insulating film 4 for smoothing irregularities resulting from the circuitry, and a plurality of pixel electrodes 5 corresponding to the pixel circuits 2 are provided thereon. The pixel electrodes 5 are connected to the corresponding pixel circuits 2 via contact holes. The edges of the pixel electrodes 5 are covered with a second organic insulating film 6. Organic compound layers 7 including light-emitting layers are provided in regions uncovered with the second organic insulating film 6 on the pixel electrodes 5 so as to contact the pixel electrodes 5. An upper electrode 8 is provided over the organic compound layers 7. The structures surrounded by the dotted lines, including the pixel electrodes 5, the upper electrode 8, and the organic compound layers 7 held therebetween, are organic light-emitting elements 9.

The organic light-emitting elements 9 are covered with an organic protective film 10 and an inorganic protective film 11. The organic protective film 10 is intended to smooth surface irregularities in the display region A, including irregularities resulting from the element structures and irregularities resulting from foreign matter deposited on the surface during a manufacturing process. Therefore, the organic protective film 10 may have a thickness of 5 to 30 μm. The display region A smoothed by the organic protective film 10 is covered with the inorganic protective film 11, which is highly moisture-proof so that no moisture intrude from outside. The inorganic protective film 11 may have a thickness of about 0.5 to 3 μm because an extremely thin film does not provide sufficient moisture-proof performance and an extremely thick film may be cracked by a film stress. In addition, an inorganic base film may be formed between the organic protective film 10 and the upper electrode 8. If the inorganic base film is formed, it reduces the cure contractive force, occurring as the organic protective film material is cured, and the film stress, left after the curing, that are transmitted to the films closer to the substrate side than the upper electrode 8, thus preventing the films from peeling off. The inorganic base film may have a thickness of about 0.1 to 3 μm.

Structure of Frame Region

Next, the structure of a frame region O-S of the display apparatus will be described. In the drawings, a position O is an end of the display region A, a position S is the end of the support substrate 1, a position P is the end of a grooved region on the display region side, a position R is the end of the grooved region on the substrate end side, and a position Q is somewhere between the positions P and R. Although not shown in FIGS. 1A to 1C, components such as peripheral circuits and wiring lines for driving the pixel circuits 2 are provided in the frame region O-S.

The frame region O-S includes a grooved region P-R where a plurality of grooves 12 are provided and an ungrooved region R-S, surrounding the grooved region P-R, where no groove is provided. The grooves 12 are arranged in the grooved region P-R along the contours of the display region A so as to extend from the position P near the display region A to the predetermined position R in a direction across the contours of the display region A. The ungrooved region R-S surrounds the grooved region P-R, and the outermost surface in the ungrooved region R-S is defined by a member formed of an inorganic material. For example, the surface of the support substrate 1, which is formed of an inorganic material such as glass, may be exposed in the ungrooved region R-S, or the inorganic insulating film 3, formed in the display region A, as shown in FIGS. 1A to 1C, may be formed so as to extend to the ungrooved region R-S and define the outermost surface therein.

The organic protective film 10 is not formed in the ungrooved region R-S, but is formed on the display region side of the position R. The inorganic protective film 11 covers the organic protective film 10 and extends to the ungrooved region R-S. Because the inorganic protective film 11 contacts a member formed of an inorganic material in the ungrooved region R-S, the inorganic protective film 11 achieves high adhesion, thus preventing film peeling, and also cuts off moisture intrusion paths from the side surfaces and the bottoms of the display elements through a member formed of an organic material. The region O-P is provided depending on the size of the process margin required for forming the inner structure of the display region A.

Next, the grooves 12 provided in the grooved region P-R will be described in greater detail. If the organic protective film material is applied so that the end thereof is located in the grooved region P-R, that is, above the grooves 12, the organic protective film material spreads along the grooves 12 to the predetermined position R. This allows the end of the organic protective film 10 to be reliably formed at the predetermined position R even if an error occurs during a wet process. Although in this embodiment the grooves 12 are formed by extending the same member as the second organic insulating film 6 in the display region A to the frame region O-R, the grooves 12 can be formed using a material other than the second organic insulating film 6. For example, the grooves 12 may be formed using the first organic insulating film 4, the inorganic insulating film 3, a wiring material, or a combination thereof.

Figure 6A:
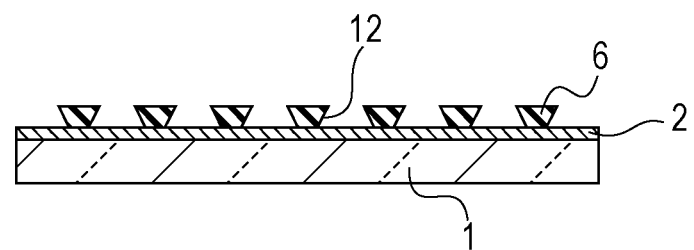
FIGS. 6A and 6B are sectional views of grooves in the present invention.
Figure 6B:
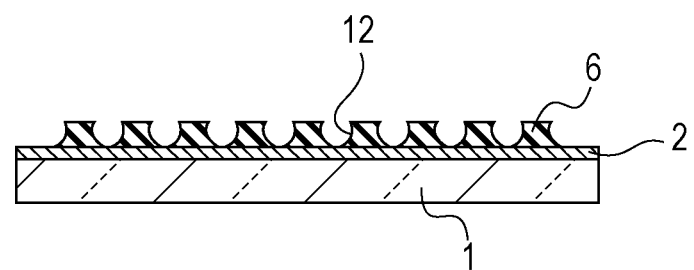

The mechanism by which the organic protective film material spreads along the grooves 12 to the predetermined position R is due to capillary action. Because the viscosity of the organic protective film material suitable for the present invention is 50 to 250 cp, the width of the grooves 12 may be 5 to 100 μm. The depth of the grooves 12 may be 100 nm or more. The spacing between the grooves 12 may be 5 to 10 μm because a narrower spacing allows the organic protective film material to spread more easily. The width of the grooves 12 and the spacing therebetween may be constant, as in FIG. 1, or may vary within the predetermined ranges described above. In addition, the sectional shape of the grooves 12 does not necessarily have to have a uniform width from top to bottom as in FIG. 1C, but may have varying widths from top to bottom, as in FIG. 6A, or may be curved at the bottoms of the grooves 12, as in FIG. 6B.

Figure 7A:
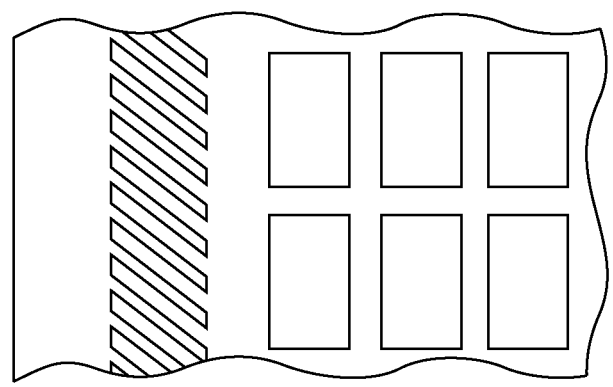
FIGS. 7A and 7B are plan views of groove patterns in the present invention.
Figure 7B:
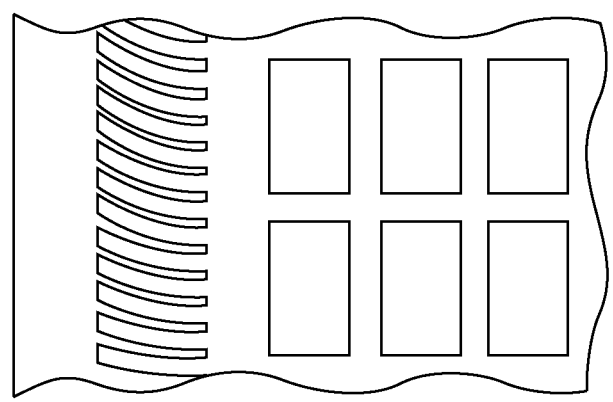
Figure 8:
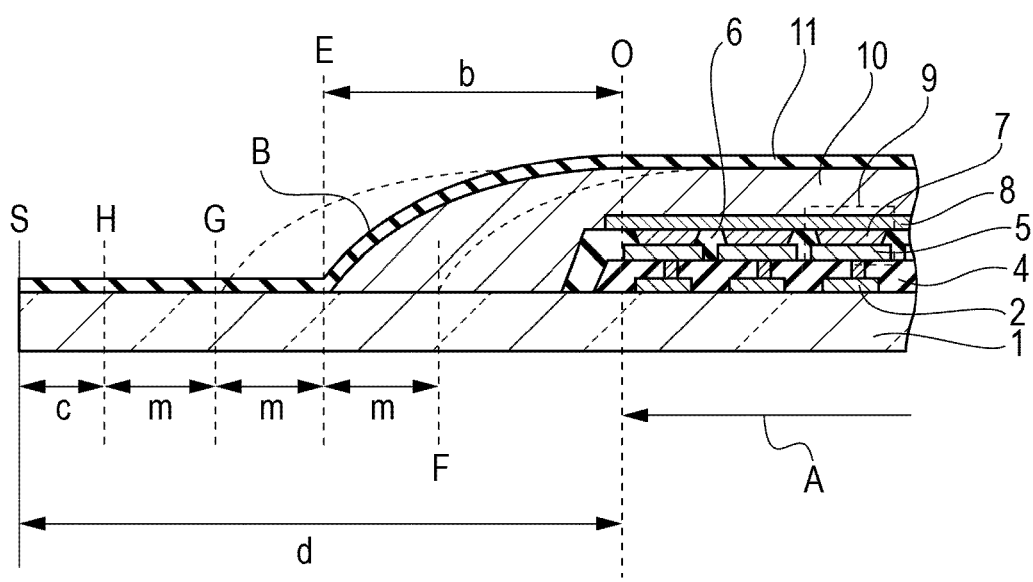
FIG. 8 is a diagram illustrating a problem with the related art.

Furthermore, the grooves 12 do not necessarily have to be perpendicular to the line drawn by the end R of the organic protective film 10, as shown in FIG. 7A, or do not necessarily have to be linear, as shown in FIG. 7B, as long as the grooves 12 are arranged in a direction across the line drawn by the end R of the organic protective film 10. However, if linear grooves 12 are formed perpendicularly to the line drawn by the end R of the organic protective film 10, the organic protective film material can be spread to the predetermined position R in a short time.

The frame width d required for the display apparatus having the grooves 12 can be represented by the relationship between the error m due to a wet process and the width b of a sloped portion B case by case as follows:

(i) if $2m \leq b, d \geq b+c$ (ii) if $2m > b, d \geq 2m+c$     (2)

If inequalities (2) are compared with inequality (1), which represents the frame width d required in the related art, a reduction in frame width of 2 m can be achieved in the case (i), and a reduction in frame width of b can be achieved in the case (ii).

In the display apparatus according to the first embodiment, as described above, the grooves 12 provided near the position where the end of the organic protective film 10 is formed allow the end of the organic protective film 10 to be reliably formed at the position R. The distance from the position R to the display region A is set to be at or above the width of the sloped portion B so that the sloped portion B of the organic protective film 10 does not overlap the display region A, thereby avoiding image degradation. In addition, the ungrooved region R-S can be reliably provided around the grooved region P-R to cut off moisture intrusion paths from the side surfaces and the bottoms of the display elements.

Second Embodiment

Figure 2A:
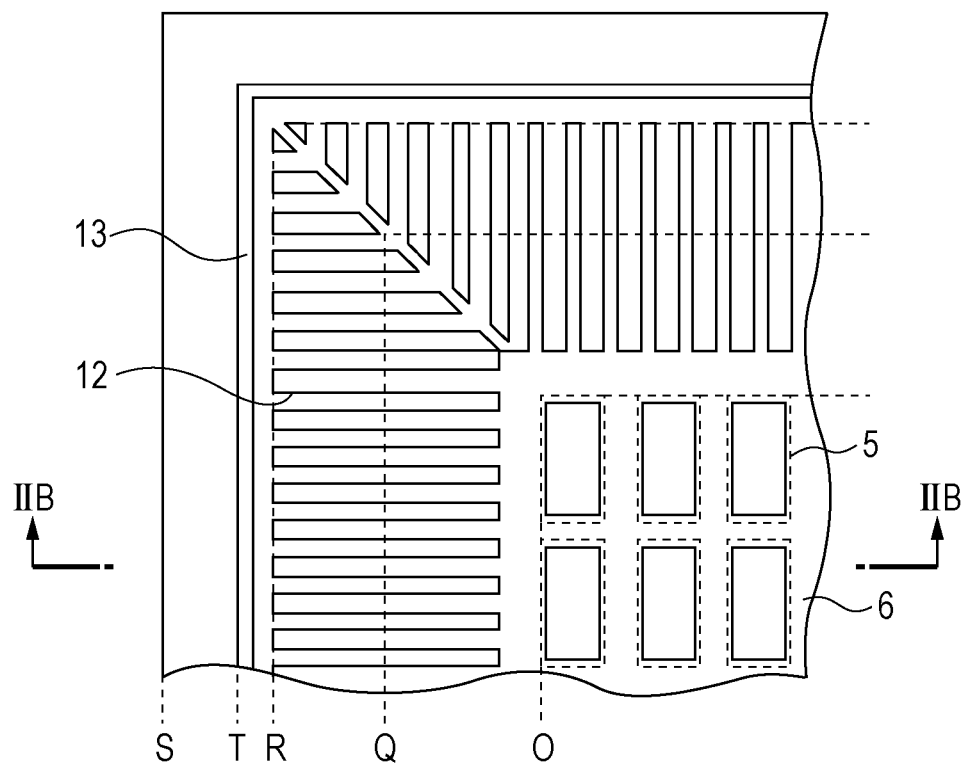
FIGS. 2A and 2B are a top view and a sectional view, respectively, schematically showing a display apparatus according to a second embodiment of the present invention.
Figure 2B:
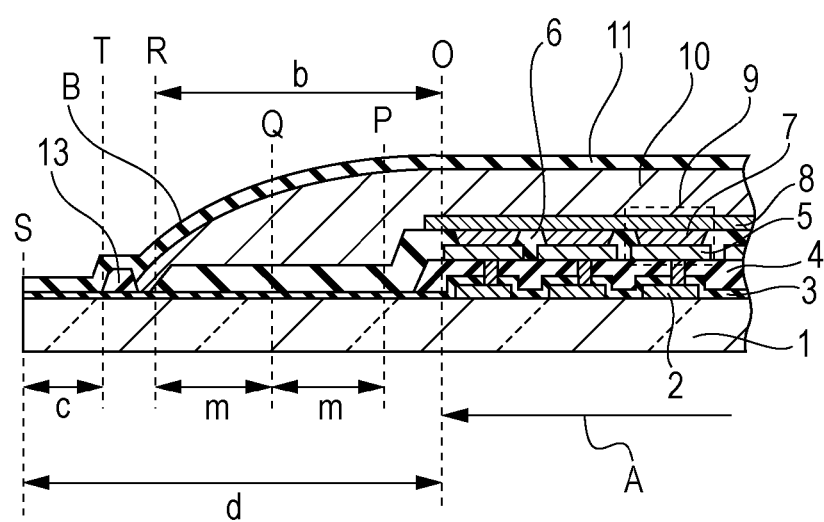

FIGS. 2A and 2B are diagrams showing a display apparatus according to a second embodiment of the present invention. FIG. 2A is a plan view of a corner of the display apparatus according to the second embodiment. For illustration purposes, the second organic insulating film 6 is exposed in FIG. 2A. FIG. 2B is a sectional view taken along line IIB-IIB in FIG. 2A, with seal films added thereto. The second embodiment differs from the first embodiment in that a bank 13 is provided around the grooved region P-R. If the bank 13 is provided, an organic protective film material spreading to the ends of the grooves 12 further spreads along the bank 13, thus forming an organic protective film 10 having a uniform end shape. In addition, the bank 13 is suitable for use with an organic protective film material having relatively low viscosity because it also has the effect of stopping the organic protective film material. The bank 13 may be separated from the ends of the grooves 12 by a distance of about 5 to 50 μm, rather than joined thereto. If the distance between the bank 13 and the ends of the grooves 12 is excessively large, the organic protective film material may fail to reach the bank 13. Although the grooves 12 and the bank 13 are formed using the second organic insulating film 6 in FIGS. 2A and 2B, they may be formed using a different material. For example, the grooves 12 and the bank 13 may be formed using the first organic insulating film 4, the inorganic insulating film 3, electrodes, or a combination thereof.

If the bank 13 is provided, the organic protective film 10 is formed so as to extend to the peripheral position T of the bank 13. In this case, a region T-S where the inorganic protective film 11 contacts a member formed of an inorganic material can be provided around the bank 13 to cut off moisture intrusion paths from the side surfaces of the seal structure and the bottoms of the display elements.

Third Embodiment

Figure 3A:
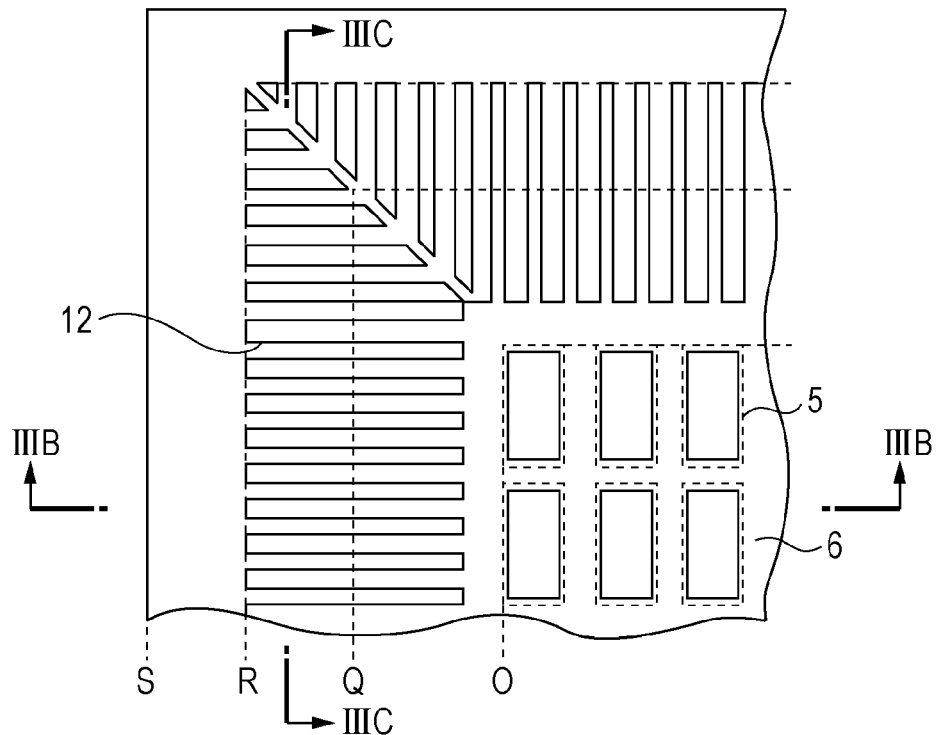
FIGS. 3A, 3B, and 3C are a top view, a sectional view, and a sectional view, respectively, schematically showing a display apparatus according to a third embodiment and Example 3 of the present invention.
Figure 3B:
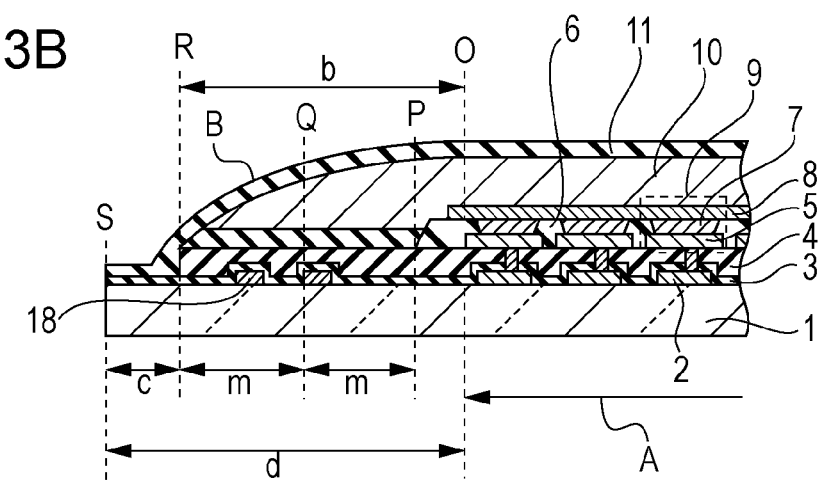
Figure 3C:
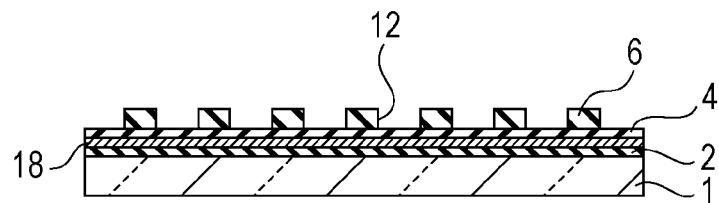

FIGS. 3A to 3C are diagrams showing a display apparatus according to a third embodiment of the present invention. FIG. 3A is a plan view of a corner of the display apparatus according to the third embodiment. For illustration purposes, the second organic insulating film 6 is exposed in FIG. 3A. FIG. 3B is a sectional view taken along line IIIB-IIIB in FIG. 3A, with seal films added thereto. FIG. 3C is a partial sectional view taken along line IIIC-IIIC in FIG. 3A. In the third embodiment, the first organic insulating film 4 is also provided in the grooved region P-R to smooth the bottom surfaces of the grooves 12. This structure prevents irregularities due to components such as peripheral circuits and wiring lines 18 provided in the frame region O-S from obstructing the spreading of the organic protective film material along the grooves 12 by extending across the grooves 12. Therefore, the peripheral circuits and the wiring lines 18 can also be provided in the grooved region P-R, thus achieving a further reduction in frame width.

Production Method

Next, an example of a method for producing the display apparatus according to the first embodiment will be described with reference to FIGS. 1A to 1C.

The pixel circuits 2 and the peripheral circuits, which include thin-film transistors (TFT), can be formed on an insulating support substrate 1 formed of an inorganic material such as glass by a known method. After the inorganic insulating film 3 is formed by a known vacuum deposition process over the entire surface of the support substrate 1 on which the pixel circuits 2 are formed, a photosensitive resin is applied using a spin coater in air and is cured by heating, thus forming the first organic insulating film 4. Subsequently, the first organic insulating film 4 is removed from a region around the display region A by photolithography and, at the same time, contact holes for connecting the pixel electrodes 5 and the pixel circuits 2 are formed.

The pixel electrodes 5 can be formed by a known vacuum deposition process such as sputtering. Specifically, a conductive material is deposited on the entire surface by vacuum deposition and is patterned into pixels by photolithography. As a result, the pixel electrodes 5 are connected to the pixel circuits 2 via the contact holes formed in the first organic insulating film 4. The support substrate 1 on which the pixel electrodes 5 are formed is also hereinafter simply referred to as the substrate.

Subsequently, as in the case of the first organic insulating film 4, a second organic insulating film material is applied to the entire surface of the substrate on which the pixel electrodes 5 are formed and is patterned by photolithography. In the display region A, the second organic insulating film 6 is patterned so as to cover the edges of the pixel electrodes 5 and so as to have openings in the centers of the pixel electrodes 5. In the frame region O-S, the grooved region P-R is formed by patterning the second organic insulating film 6 so that the grooves 12 extend from the position P to the position R, and the ungrooved region R-S is formed by removing the second organic insulating film 6 from the region around the grooved region P-R. The grooved region P-R and the ungrooved region R-S may be formed so as to surround the four sides of the display region A. The frame region O-S can be minimized if the distance from the end O of the display region A to the ends of the grooves 12, that is, the position R where the end of the organic protective film 10 is formed is set to b in the case (i) or is set to 2 m in the case (ii) in inequalities (2). In practice, however, a process margin of about several tens to several hundreds of micrometers may be added. If the second organic insulating film 6 is formed so as to cover at least the end of the first organic insulating film 4, the first organic insulating film 4 can be prevented from peeling off or being corroded in the subsequent etching step. After the patterning of the second organic insulating film 6, the substrate is sufficiently annealed to remove moisture from the first organic insulating film 4 and the second organic insulating film 6, thus preventing deterioration of the organic compound material to be deposited later.

The organic compound layers 7 can be formed using a known material by a known method such as evaporation, laser transfer, or coating. If the organic compound layers 7 are formed by evaporation, a mask having openings corresponding to the openings of the second organic insulating film 6 is used. The process following the formation of the organic compound layers 7 is carried out in an atmosphere whose dew point is controlled at least until the inorganic protective film 11 is sealed to prevent moisture from intruding into the organic compound layers 7 during the process.

Subsequently, the organic protective film material is applied so that the end thereof is located at the position Q in the grooved region P-R. In FIGS. 1A to 1C, the position Q is set to the center of the grooved region P-R and is separated from the positions P and R by the error m due to a wet process or more. Even if the organic protective film material is applied such that the end thereof deviates from the position Q to the display region side or to the opposite side by m, the end of the organic protective film material is formed above the grooves 12, and the organic protective film material spreads to the position R along the grooves 12. As a result, the end of the organic protective film 10 can be reliably formed at the position R irrespective of the positional accuracy of the wet process. The position Q does not necessarily have to be set to the center of the grooved region P-R, but may be set so that the position where the end of the organic protective film 10 is formed is located over the grooves 12 even if it deviates by the error m due to a wet process. If the distance between the end position R of the organic protective film 10 and the end position O of the display region A is larger than the sloped portion B, the sloped portion B does not overlap the display region A, thus avoiding image degradation. The applied organic protective film material is cured by heating or UV irradiation, thus forming the organic protective film 10. Although the viscosity of the organic protective film material suitable for the wet process is 50 to 25,000 cp, the viscosity may be 1 to 2,500 cp to utilize capillary action. In this example, even a material having a viscosity of 2,500 to 25,000 cp during the application can be used if the material is one whose viscosity is temporarily decreased to 1 to 2,500 cp by heating, such as a thermosetting resin. The organic protective film material can be applied by a known method such as printing or dispensing.

Finally, the inorganic protective film 11 is formed. The inorganic protective film 11 is formed so as to cover the organic protective film 10 and so as to extend over the ungrooved region R-S. The inorganic protective film 11 can be formed by a known vacuum deposition process such as plasma-enhanced CVD or sputtering.

The display apparatuses according to the second and third embodiments can be produced in the same manner as the display apparatus according to the first embodiment. For the second embodiment, the bank 13 may be formed by patterning. For the third embodiment, the first organic insulating film 4 may be formed in a pattern from which the region outside the position R is removed.

Example 1

A process of producing a display apparatus having the same structure as that of the first embodiment will now be described with reference to FIGS. 4A to 4C. In this example, the width of the sloped portion B was estimated to be about 1 mm.

Figure 4A:
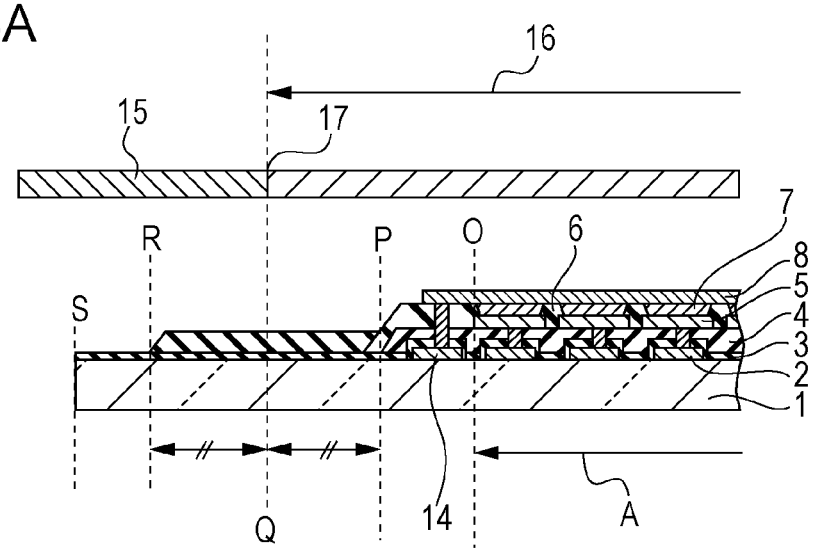
FIGS. 4A to 4C are sectional views showing a first organic insulating film and an upper electrode of the display apparatus according to Example 1 of the present invention.
Figure 4B:
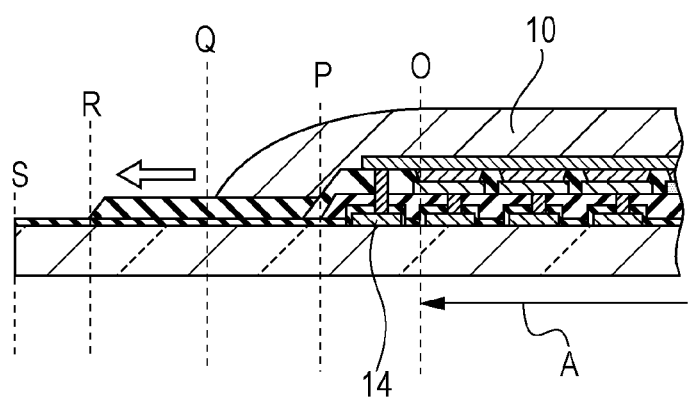
Figure 4C:
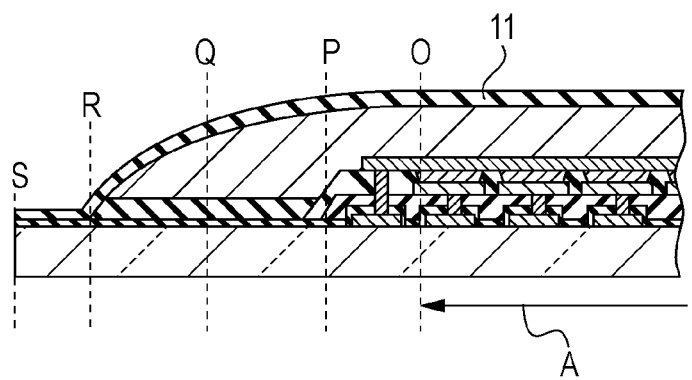

First, a process of producing an unsealed substrate in FIG. 4A will be briefly described. Circuits including polysilicon TFTs were formed on a glass substrate 1 having a length of 100 mm, a width of 100 mm, and a thickness of 0.5 mm. Specifically, the pixel circuits 2 were formed in the display region A, and the peripheral circuits (not shown) for driving the pixel circuits 2 were formed in the frame region O-S.

Next, an inorganic insulating film 3 of SiN having a thickness of 700 nm was formed by CVD on the support substrate 1 on which the circuits were formed. Subsequently, a photoresist UV-curable acrylic resin was applied using a spin coater, was prebaked, and was exposed at 1,800 mW through a photomask having a pattern for removing the acrylic resin from the positions corresponding to the contact holes and the frame region. The acrylic resin was removed from the regions where the resin was unnecessary using a developer and was postbaked at 200° C., thus forming a first organic insulating film 4 having a thickness of 2 μm. As a result, the first organic insulating film 4 was formed in the display region A and the region O-P where the peripheral circuits or the wiring lines 14 were formed. The distance from the end O of the display region A to the end P of the first organic insulating film 4 was 600 μm.

Next, as the pixel electrodes 5, a multilayer film including an aluminum film having a thickness of 100 nm and a film of a mixture of indium oxide and zinc oxide having a thickness of 50 nm was formed by sputtering. Specifically, the multilayer film for electrodes was formed over the entire surface of the substrate and was patterned in an electrode pattern by photolithography, thus forming the pixel electrodes 5. The pixel electrodes 5 were electrically connected to the pixel circuits 2 via the contact holes formed in the first organic insulating film 4.

Next, the second organic insulating film material, namely, a polyimide resin, was applied at a thickness of 1.6 μm on the first organic insulating film 4 and the pixel electrodes 5 using a spin coater. Subsequently, by photolithography, openings corresponding to the pixel electrodes 5 were formed in the display region A, and the grooved region P-R where the grooves 12 were provided and the ungrooved region R-S from which the polyimide resin was removed were formed in the frame region O-S. The width of the grooves 12 and the spacing therebetween were 10 μm. Because the error due to the process of forming the organic protective film 10 was estimated to be ±200 μm, a process margin of 100 μm was added, and accordingly the width of the grooved region P-R was 500 μm. Grooves 12 having the pattern shown in FIG. 1A were formed in the regions corresponding to the corners of the organic protective film 10. The width of the ungrooved region R-S was 300 μm.

The substrate on which the second organic insulating film material was patterned was cured and dehydrated by heating it at 150° C. under a pressure of $10^{-2}$ Pa for ten minutes, thus forming the second organic insulating film 6, and the organic compound layers 7 were then formed on the pixel electrodes 5 in the display region A. The organic compound layers 7 were formed by sequentially forming a hole transport layer, a light-emitting layer, an electron transport layer, and an electron injection layer by resistance heating evaporation using known organic materials. Subsequently, a conductive layer of a mixture of indium oxide and zinc oxide having a thickness of 50 nm was formed over the organic compound layers 7 by sputtering as the upper electrode 8.

Next, as the organic protective film material, a thermosetting epoxy resin having a viscosity of 2,500 cp was applied by screen printing in a nitrogen atmosphere with a dew temperature of −60° C. As shown in FIG. 4A, the screen printing plate used for application of the organic protective film material was designed and aligned so that an edge 17 of an opening 16 coincided with the central position of the grooved region P-R. The opening 16 was surrounded by a non-opening portion 15 formed of, for example, an emulsion so that the organic protective film material did not adhere to the substrate. As shown in FIG. 4B, the end of the epoxy resin immediately after the printing was located at an uncertain position in the grooved region P-R. Subsequently, the epoxy resin was cured by heating it at 100° C. in a vacuum environment for 30 minutes, thus forming an organic protective film 10 having a thickness of 15 μm. As shown in FIG. 4C, it was confirmed that the end of the cured organic protective film 10 reached the predetermined position R, that is, the end of the grooves 12. This is because the viscosity of the epoxy resin was temporarily decreased so that it spread along the grooves 12 before being cured during the heating step for curing the epoxy resin.

Subsequently, an inorganic protective film 11 of silicon nitride was deposited by plasma-enhanced CVD using $SiH_4$ gas, $N_2$ gas, and $H_2$ gas. The inorganic protective film 11 had a thickness of 1 μm and was formed so as to cover the entire display region A where the organic light-emitting elements were formed and the entire frame region O-S.

In the display apparatus produced by the process described above, the end position of the organic protective film 10 could be formed at the predetermined position R. Accordingly, whereas a frame width of 1,400 μm or more is required in the related art, the frame width of the display apparatus could be reduced to 1,100 μm. In addition, the display apparatus did not suffer image degradation because the sloped portion B of the organic protective film 10 did not overlap the display region A.

Example 2

A display apparatus was produced in the same manner as in Example 1 except that the grooves 12 were formed using the same member as the pixel electrodes 5, the bank 13 was formed around the grooved region P-R using the same member as the second organic insulating film 6, and the organic protective film 10 was formed by dispensing. A description of the same steps as in Example 1 will be omitted.

Figure 5A:
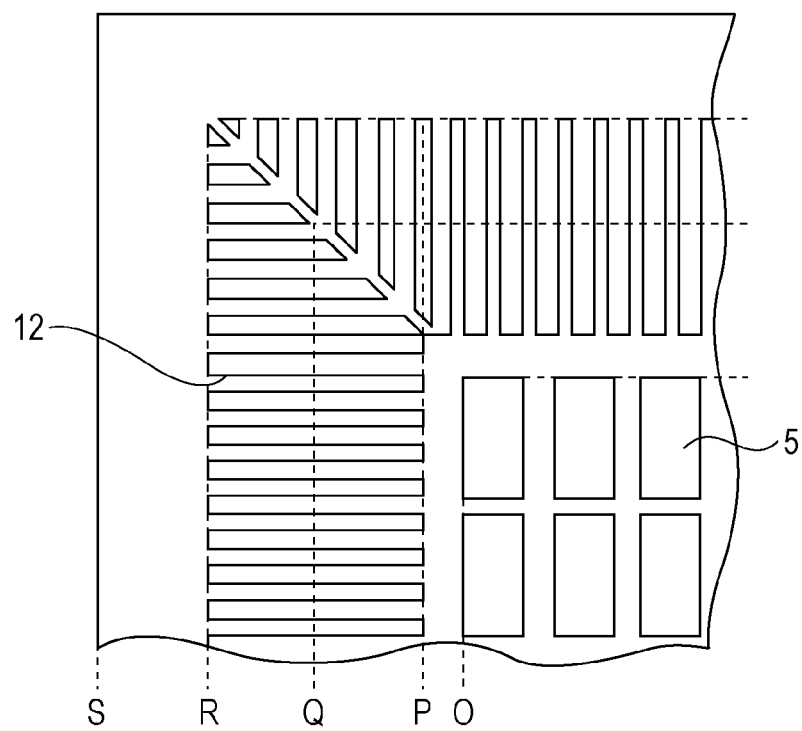
FIGS. 5A and 5B are diagrams showing a process of producing a display apparatus according to Example 2.
Figure 5B:
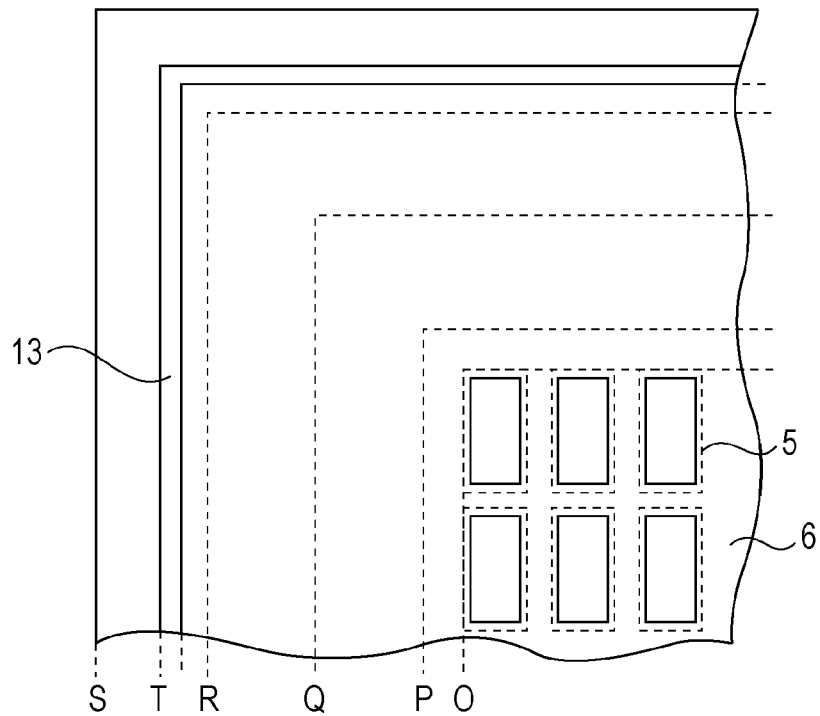

As in Example 1, as the pixel electrodes 5, an aluminum film having a thickness of 100 nm and a film of a mixture of indium oxide and zinc oxide having a thickness of 50 nm were formed over the entire surface of the substrate by sputtering. Subsequently, the film of the mixture of indium oxide and zinc oxide was patterned in the same manner as in Example 1 in the display region A and, at the same time, was patterned into strips having a width of 10 μm and a spacing of 10 μm in the frame region O-S, thus forming the grooves 12. The planar pattern of the pixel electrodes 5 is shown in FIG. 5A. Subsequently, as in Example 1, as the second organic insulating film material, a polyimide resin was applied at a thickness of 1.6 μm. Subsequently, by photolithography, openings corresponding to the pixel electrodes 5 were formed in the display region A, and the bank 13 was formed in the frame region O-S. The planar pattern of the second organic insulating film 6 is shown in FIG. 5B. The bank 13 had a width of 10 μm and was separated from the ends of the grooves 12 by a distance of 10 μm.

Next, a thermosetting epoxy resin having a viscosity of 1,000 Pa·s was applied using a dispenser capable of fine drawing (SHOT MINI SL, manufactured by Musashi Engineering, Inc.) in a nitrogen atmosphere with a dew temperature of −60° C. The end of the epoxy resin was formed by applying it such that a nozzle of the dispenser was shifted along the central position Q of the grooved region P-R. The applied epoxy resin immediately spread along the grooves 12 and, upon reaching the ends of the grooves 12, spread along the bank 13. The applied epoxy resin was cured by heating it at 100° C. in a vacuum environment for 30 minutes, thus forming an organic protective film 10 having a thickness of 30 μm. Thereafter, a display apparatus was produced as in Example 1.

By the process described above, the organic protective film 10 could be reliably formed so as to reach the bank 13. Accordingly, whereas a frame width of 1,400 μm or more is required in the related art, the frame width of the display apparatus could be reduced to 1,120 μm. In addition, the display apparatus did not suffer image degradation because the sloped portion B of the organic protective film 10 did not overlap the display region A.

Example 3

A display apparatus was produced in the same manner as in Example 1 except that the first organic insulating film 4 was formed in a different pattern. The positional relationship between the first organic insulating film 4 and the second organic insulating film 6 is as shown in FIGS. 3A to 3C. In this example, because the bottoms of the grooves 12 formed of the second organic insulating film 6 were smoothed by the first organic insulating film 4, the peripheral circuits and the grooves 12 could be provided so as to overlap each other.

In the display apparatus produced by the process described above, the end position of the organic protective film 10 could be formed at the predetermined position R. Accordingly, whereas a frame width of 1,400 μm or more is required in the related art, the frame width of the display apparatus could be reduced to the same width as the sloped portion B of the organic protective film 10, namely, 1,000 μm. In addition, the display apparatus did not suffer image degradation because the sloped portion B of the organic protective film 10 did not overlap the display region A.

Whereas display apparatuses using organic light-emitting elements as display elements have been described above, the present invention can be applied to a display apparatus having a seal structure including an organic protective film irrespective of the type of display element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-282284 filed Dec. 11, 2009, which is hereby incorporated by reference herein in its entirety.

What is claimed is:

1. A display apparatus comprising:
   a substrate;
   a plurality of light-emitting elements disposed in a display region of the substrate;
   an organic protective film covering the display region; and
   an inorganic protective film covering the organic protective film;
   the display apparatus having:
   a first region where a plurality of grooves are arranged, wherein the plurality of grooves extend in a direction across an edge of the substrate along a profile of the display region, and the plurality of grooves and display region are covered with the organic protective film; and
   a second region, surrounding the first region where the grooves are provided, where the grooves and the organic protective film are not provided and formed by extending the inorganic protective film from the display region.

2. The display apparatus according to claim 1, wherein the width of the grooves is 5 to 100 μm.

3. The display apparatus according to claim 1, wherein the spacing between the grooves is 5 to 10 μm.

4. The display apparatus according to claim 1, wherein the outermost surface in the second region where the grooves are not provided comprises an inorganic material.

* * * * *